United States Patent
Misu et al.

(10) Patent No.: US 9,312,337 B2
(45) Date of Patent: Apr. 12, 2016

(54) SEMICONDUCTOR DEVICE

(71) Applicant: Kabushiki Kaisha Toshiba, Minato-ku, Tokyo (JP)

(72) Inventors: Shinichiro Misu, Tokyo (JP); Kazutoshi Nakamura, Himeji (JP)

(73) Assignee: Kabushiki Kaisha Toshiba, Tokyo (JP)

(*) Notice: Subject to any disclaimer, the term of this patent is extended or adjusted under 35 U.S.C. 154(b) by 56 days.

(21) Appl. No.: 14/202,970

(22) Filed: Mar. 10, 2014

(65) Prior Publication Data

US 2015/0069461 A1    Mar. 12, 2015

(30) Foreign Application Priority Data

Sep. 11, 2013  (JP) .................................. 2013-188304

(51) Int. Cl.
| | |
|---|---|
| *H01L 29/66* | (2006.01) |
| *H01L 29/10* | (2006.01) |
| *H01L 29/739* | (2006.01) |

(52) U.S. Cl.
CPC ........ *H01L 29/1095* (2013.01); *H01L 29/7397* (2013.01)

(58) Field of Classification Search
CPC .......................... H01L 29/7397; H01L 29/1095
USPC ........................................................ 257/139
See application file for complete search history.

(56) References Cited

U.S. PATENT DOCUMENTS

| | | |
|---|---|---|
| 2011/0233607 A1 | 9/2011 | Yanagisawa et al. |
| 2012/0025874 A1 | 2/2012 | Saikaku et al. |
| 2014/0334212 A1 | 11/2014 | Hashimoto et al. |

FOREIGN PATENT DOCUMENTS

| | | |
|---|---|---|
| JP | 2007-013224 A | 1/2007 |
| JP | 2010-109545 A | 5/2010 |
| JP | 2010-135677 A | 6/2010 |
| JP | 2011-018694 A | 1/2011 |
| JP | 2011-204711 A | 10/2011 |
| JP | 2012-064908 A | 3/2012 |
| JP | 2012-244042 A | 12/2012 |
| WO | 2013-088544 A1 | 6/2013 |

OTHER PUBLICATIONS

Japanese Office Action issued on Jan. 29, 2016 in corresponding Japanese Application No. 2013-188304, along with English translation thereof.

*Primary Examiner* — Douglas Menz
(74) *Attorney, Agent, or Firm* — White & Case LLP

(57) ABSTRACT

This device includes a first base layer of a first conduction type. A second base-layer of a second conduction type is provided above the first base-layer. A first semiconductor layer of the first conduction type is above an opposite side of the second base-layer to the first base-layer. A second semiconductor layer of the second conduction type is above an opposite side of the first base-layer to the second base-layer. A plurality of first electrodes are provided at the first semiconductor layer and the second base-layer via first insulating films. A second electrode is provided between adjacent ones of the first electrodes and provided at the first semiconductor layer and the second base-layer via a second insulating film. A resistance of the first base-layer above a side of the second electrode is lower than a resistance of the first base-layer above a side of the first electrodes.

8 Claims, 4 Drawing Sheets

SEMICONDUCTOR DEVICE

CROSS REFERENCE TO RELATED APPLICATIONS

This application is based upon and claims the benefit of priority from the prior Japanese Patent Application No. 2013-188304, filed on Sep. 11, 2013, the entire contents of which are incorporated herein by reference.

FIELD

The embodiments of the present invention relate to a semiconductor device.

BACKGROUND

It is conventionally proposed to increase the impurity concentration of an n-barrier layer between an n-base layer and a p-base layer so as to decrease an ON-state voltage of an IGBT (Insulated Gate Bipolar Transistor). When the impurity concentration of the n-barrier layer is increased, then a potential barrier of the n-barrier layer for holes increases, and the number of holes accumulated in the n-base layer increases, resulting in the decrease in the ON-state voltage of the IGBT.

However, the conventional technique has the following problems. When the impurity concentration of the n-barrier layer is increased, more holes are attracted to an electron current along a MOS channel and accumulated around a trench gate. When more holes are accumulated around the trench gate, negative charge is induced in the trench gate, and a variation slope (dQg/dVg) of between a gate charges (Qg) and a gate voltage (Vg) is decreased to a negative vale (to negative capacitance). When the variation slope is negative, then a voltage applied to the trench gate varies largely, the potential of a gate electrode rises, and a current excessively is applied to the IGBT. As a result, the IGBT may be broken down in.

DETAILED DESCRIPTION

Embodiments will now be explained with reference to the accompanying drawings. The present invention is not limited to the embodiments. In the following embodiments, a vertical direction of a semiconductor device indicates a relative direction for the sake of convenience and often differs from a vertical direction according to gravitational acceleration.

A semiconductor device according to the present embodiments includes a first base layer of a first conduction type. A second base-layer of a second conduction type is provided above the first base-layer. A first semiconductor layer of the first conduction type is above an opposite side of the second base-layer to the first base-layer. A second semiconductor layer of the second conduction type is above an opposite side of the first base-layer to the second base-layer. A plurality of first electrodes are provided at the first semiconductor layer and the second base-layer via first insulating films. A second electrode is provided between adjacent ones of the first electrodes and provided at the first semiconductor layer and the second base-layer via a second insulating film. A resistance of the first base-layer above a side of the second electrode is lower than a resistance of the first base-layer above a side of the first electrodes.

First Embodiment

Figure 1:
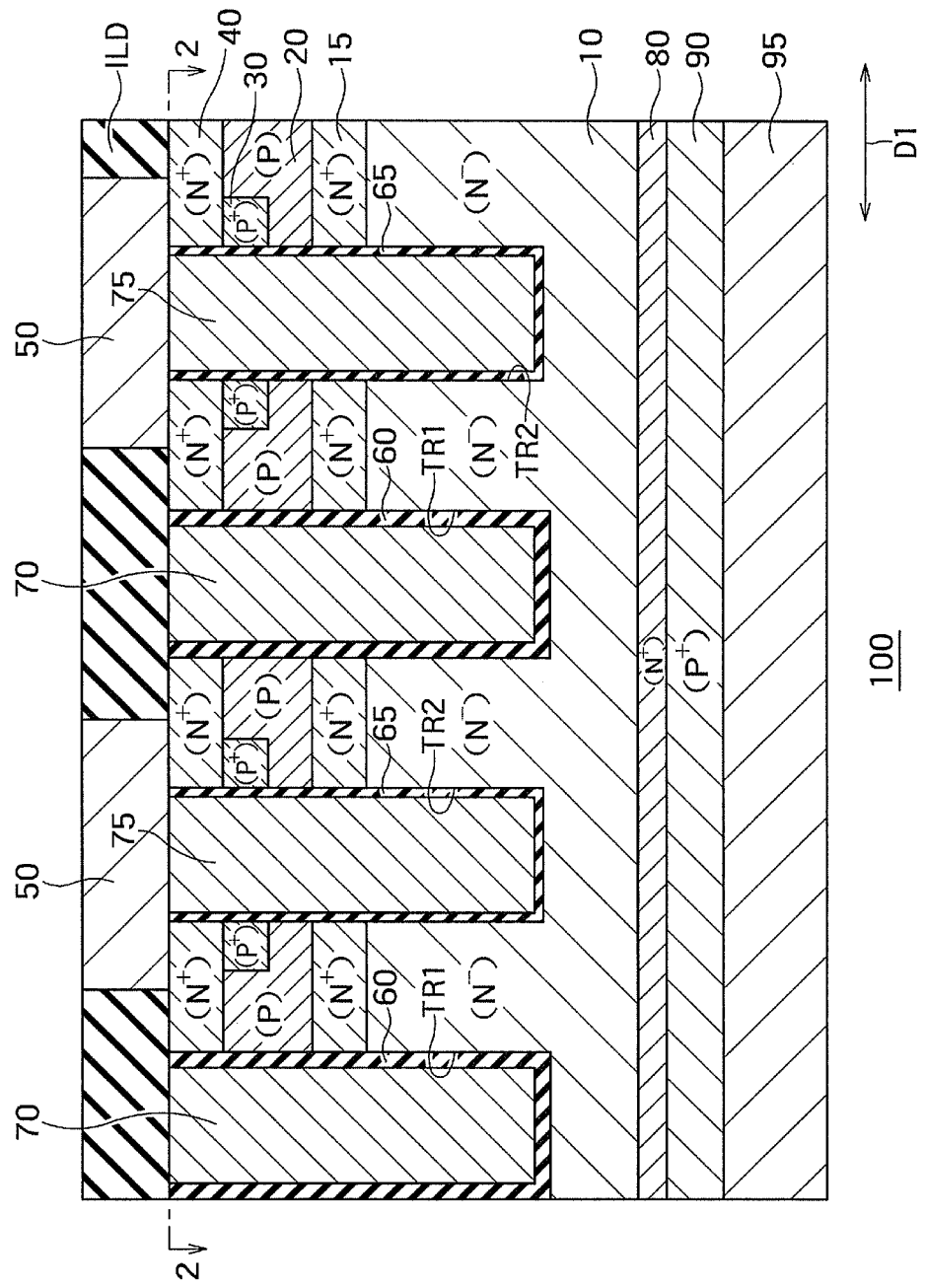
FIG. 1 is a cross-sectional view showing an example of a configuration of an IGBT 100 according to a first embodiment.

FIG. 1 is a cross-sectional view showing an example of a configuration of an IGBT 100 according to a first embodiment. The IGBT 100 includes an n⁻ first base layer 10, an n⁺ first barrier layers 15, p second base layers 20, p⁺ charge extraction layers 30, n⁺ emitter layers 40, emitter electrodes 50, first insulating films 60 (hereinafter, "gate dielectric films 60"), second insulating films 65, first electrodes 70 (hereinafter, "gate electrodes 70"), second electrodes 75, an n⁺ second barrier layer 80, a p⁺ collector layer 90, and a collector electrode 95.

The first base layer (hereinafter, "n-base layer") 10 is a semiconductor layer through which carriers (electrons or holes) drift. The first barrier layer 15 is provided on the n-base layer 10. The first barrier layer 15 is provided to improve an IE (injection Enhanced) effect and to decrease an ON-state voltage. The second base layer (hereinafter, "p-base layer") 20 is provided on the first barrier layer 15. A channel region is formed in the p-base layer 20 when the IGBT 100 operates. A charge extraction layer 30 is provided in the p-base layer 20. The charge extraction layer 30 is provided to extract the holes drifting and moving through the n-base layer 10 to the emitter electrode 50. The emitter layer 40 serving as a first semiconductor layer is provided on the p-base layer 20 and the charge extraction layer 30.

The gate electrode 70 or the second electrode 75 is provided between the adjacent emitter layers 40. The gate electrode 70 and the second electrode 75 extend from surfaces of the emitter layers 40 to the n-base layer 10. The gate electrode 70 faces the emitter layer 40, the p-base layer 20, and the n-base layer 10 via the gate dielectric film 60. The second electrode 75 faces the emitter layer 40, the p-base layer 20, and the n-base layer 10 via the second insulating film 65.

Figure 2:
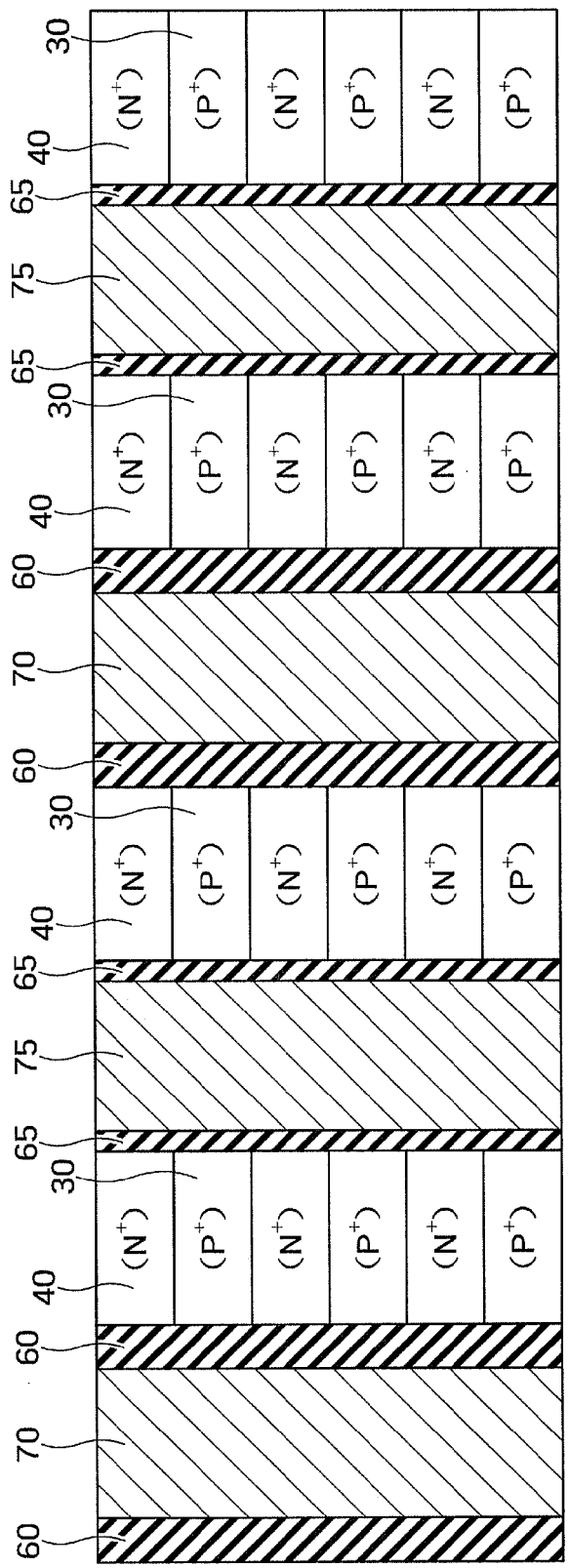
FIG. 2 is a plan view taken along a line 2-2 of FIG. 1.

Furthermore, the emitter electrode 50 is provided on the emitter layer 40 and the second electrode 75 so that the emitter electrode 50 is electrically connected to the emitter layer 40 and the second electrode 75. In the first embodiment, electrons are supplied from the emitter electrode 50 and the emitter layer 40. An interlayer dielectric film ILD is provided on the gate electrode 70. The gate electrode 70 is thereby isolated from the emitter electrode 50. The charge extraction layer 30 is directly connected to the emitter electrode 50 in a direction perpendicular on the drawing of FIG. 1 (an extending direction of the gate electrode 70). FIG. 2 is a plan view taken along a line 2-2 of FIG. 1. FIG. 2 shows upper surfaces of the charge extraction layers 30 and the emitter layers 40. As shown in FIG. 2, the charge extraction layers 30 and the emitter layers 40 alternately appear in the extending direction of the gate electrodes 70. The charge extraction layers 30 and the emitter layers 40 thereby alternately contact with the emitter electrodes 50 in the extending direction of the gate electrodes 70.

Referring back to FIG. 1, the second barrier layer 80 is provided on an opposite side of the n-base layer 10 to the first barrier layer 15. The collector layer 90 serving as a second semiconductor layer is provided under the second barrier layer 80. The second barrier layer 80 is a field stop layer. The field stop layer is provided to suppress a depletion layer extending from a pn junction between the p-base layer 20 and the barrier layer 15 from reaching the p$^+$ collector layer 90 when the IGBT 100 transitions from an ON-state to an OFF-state. The collector electrode 95 is provided under the collector layer 90 so as to be electrically connected to the collector layer 90. In the first embodiment, holes are supplied from the collector electrode 95 and the collector layer 90.

A first trench TR1 (hereinafter, also simply "trench TR1") and a second trench TR2 (hereinafter, also simply "trench TR2") are provided on both sides of the emitter layer 40, the p-base layer 20, and the first barrier layer 15, respectively. The trenches TR1 and TR2 are provided from the emitter layer 40 to a position (a depth) reaching the n-base layer 10 via the p-base layer 20 and the first barrier layer 15. In other words, one end of the trench TR1 or TR2 is located in the emitter layer 40 and the other end thereof is provided in the n-base layer 10.

The gate dielectric film 60 is provided in the trench TR1. Furthermore, the gate electrode 70 is buried in the trench TR1 via the gate dielectric film 60. As shown in FIG. 2, the gate electrode 70 as well as the trench TR1 extends in the perpendicular direction on the sheet of FIG. 1. In other words, the gate electrode 70 is provided in the emitter layer 40 and the p-base layer 20 via the gate dielectric film 60.

The second insulating film 65 is provided in the trench TR2. Furthermore, the second electrode 75 is buried in the trench TR2 via the second insulating film 65. As shown in FIG. 2, the second electrode 75 as well as the trench TR2 extends in the perpendicular direction on the sheet of FIG. 1, similarly to the gate electrode 70. In other words, the second electrode 75 is provided in the emitter layer 40 and the p-base layer 20 via the second insulating film 65.

The trenches TR1 and TR2 are alternately arranged in a direction D1 almost orthogonal to the extending direction of the trenches TR1 and TR2. Similarly, the gate electrodes 70 and the second electrodes 75 are alternately arranged in the direction D1. Therefore, as shown in FIG. 1, the second electrodes 75 are provided to be opposed to both sides of the gate electrode 70. When the IGBT 100 operates, a voltage (a positive voltage, for example) is applied to the gate electrode 70 but the second electrode 75 is kept to have a potential almost equal to that of the emitter electrode 50. That is, the second electrode 75 can be restated as a second emitter electrode because the second electrode 75 functions as an electrode having an emitter potential. The expression "potential almost equal to" indicates not only a case where a potential difference is zero but also a case where a substantially equal voltage is applied.

The n-base layer 10, the p-base layer 20, the charge extraction layer 30, the first and second barrier layers 15 and 80, the emitter layer 40, and the collector layer 90 are formed using, for example, silicon. The gate dielectric film 60, the second insulating film 65, and the interlayer dielectric film ILD are formed using, for example, an insulating film such as a silicon oxide film or a silicon nitride film. The gate electrode 70 and the second electrode 75 are formed using, for example, doped polysilicon. Further, emitter electrode 50 and the collector electrode 95 are formed using, for example, low resistance metal such as aluminum, AlSi, titanium or tungsten.

Next, the operation performed by the IGBT 100 is briefly described. To make the IGBT 100 into an ON-state, a voltage (a positive voltage, for example) is applied to the gate electrode 70 and a channel region is formed in the p-base layer 20. A voltage (a rated voltage) higher than that applied to the emitter electrode 50 is applied to the collector electrode 95. A current thereby flows between a collector and an emitter of the IGBT cell. At this time, holes are injected from the collector layer 90 and electrons are injected from the emitter layer 40. First, the electrons are injected from the emitter electrode 50 into the n-base layer 10 via the channel region of the p-base layer 20 and reach the collector layer 90. Thereafter, the holes are emitted from the charge extraction layer 30 and the emitter layer 40 via the first barrier layer 15 and the p-base layer 20 after drifting through the n-base layer 10. At this time, the holes mostly drift through the n-base layer 10 on a side of the gate electrode 70 and the n-base layer 10 on a side of the second electrode 75. When the rated voltage is applied to the collector electrode 95, a p-channel is formed in the n-base layer 10 on the side of the second electrode 75 because a voltage of the second electrode 75 is maintained to be equal to an emitter voltage. The holes, which also drift through this p-channel, are emitted from the charge extraction layer 30.

In the first embodiment, the IGBT 100 is formed so that a resistance of the n-base layer 10 on the side of the second electrode 75 is lower than that of the n-base layer 10 on the side of the gate electrode 70 when the IGBT 100 is made into an ON-state. For example, in the first embodiment, the second insulating film 65 is formed thinner than the gate dielectric film 60. This can decrease a threshold voltage of the p-channel in the n-base layer 10 on the side of the second electrode 75 and can facilitate forming the p-channel in the n-base layer 10 on the side of the second electrode 75. As a result, when the IGBT 100 is made into an ON-state, the resistance of the n-base layer 10 on the side of the second electrode 75 is decreased and many holes flow into the n-base layer 10 on the side of the second electrode 75.

As compared with a case where a thickness of the second insulating film 65 is equal to that of the gate dielectric film 60, an amount of holes flowing into the n-base layer 10 on the side of the second electrode 75 is large in the first embodiment. That is, a ratio of the amount of holes flowing into the n-base layer 10 on the side of the second electrode 75 to an amount of holes flowing into the n-base layer 10 on the side of the gate electrode 70 (hereinafter, also "hole amount ratio of the second electrode 75") in the first embodiment is higher than that in the case where the thickness of the second insulating film 65 is equal to that of the gate dielectric film 60.

When the amount of holes flowing into the n-base layer 10 on the side of the gate electrode 70 is large (the hole amount ratio of the second electrode 75 is low), then an amount of positive charge in the gate electrode 70 decreases, and a potential of the gate electrode 70 rises as described above. At this time, a gradient (dQg/dVg) of a change in gate charge (Qg) to a gate voltage (Vg) is negative. This is so-called negative capacitance, and this negative capacitance increases a current flowing to the IGBT cell and causes the IGBT to be broken down.

On the other hand, according to the first embodiment, the thickness of the second insulating film 65 is set smaller than that of the gate dielectric film 60. As a result, when the IGBT 100 is operated and made into an ON-state, resistances of the n-base layer 10 and the first barrier layer 15 on the side of the second electrode 75 are made lower than those on the side of the gate electrode 70. With this configuration, the hole amount ratio of the second electrode 75 is increased and the amount of holes flowing into the n-base layer 10 on the side of the gate electrode 70 is reduced. By reducing the amount of holes flowing in the n-base layer 10 on the side of the gate electrode 70, it is possible to suppress the gate electrode 70 in the IGBT 100 from having the negative capacitance. The IGBT 100 according to the first embodiment makes it difficult to cause breakdown.

Furthermore, according to the first embodiment, the second electrode 75 is maintained to have the emitter potential and does not function as a gate electrode. Therefore, even the reduced thickness of the second insulating film 65 does not change characteristics (threshold voltages, for example) of the IGBT 100. Therefore, according to the embodiment, it is possible to suppress the negative capacitance from occurring without changing the characteristics of the IGBT 100.

(Manufacturing Method of IGBT 100)

In the manufacturing of the IGBT 100 according to the first embodiment, it suffices to form the gate dielectric film 60 separately from the second insulating film 65.

For example, after forming the first barrier layer 15, the p-base layer 20, the charge extraction layer 30, and the emitter layer 40 on the n-base layer 10 using known processes, the trenches TR1 and TR2 are formed using a lithographic technique and an etching technique.

Inner surfaces of the trenches TR1 and TR2 are then oxidized using a thermal oxidization method. The gate dielectric film 60 is thereby formed. The gate dielectric film 60 in the trench TR2 is selectively removed while leaving the gate dielectric film 60 in the trench TR1 using the lithographic technique and the etching technique.

After removing a photoresist, the inner surfaces of the trenches TR1 and TR2 are oxidized again using the thermal oxidization method. The second insulating film 65 is thereby formed. At this time, not only the inner surface of the trench TR2 but also the inner surface of the trench TR1 is oxidized. Accordingly, oxidization conditions are set so that the gate dielectric film 60 has a desired thickness by performing the two oxidization processes. Moreover, in the second oxidization process, not only the inner surface of the trench TR2 but also that of the trench TR1 is oxidized. Accordingly, the gate dielectric film 60 is made thicker than the second insulating film 65.

Thereafter, a material (doped polysilicon, for example) of the gate electrode 70 and the second electrode 75 is buried in the trenches TR1 and TR2 using a known process. Furthermore, the second barrier layer 80, the collector layer 90, the interlayer dielectric film ILD, the emitter electrode 50, and the collector electrode 95 are formed. The IGBT 100 is thereby completed.

As described above, a manufacturing method of the IGBT 100 according to the first embodiment can be realized by adding one lithographic process, one etching process, and one thermal oxidization process to existing IGBT manufacturing processes. Therefore, the IGBT 100 according to the first embodiment can be manufactured without any particular large cost increase.

Second Embodiment

Figure 3:
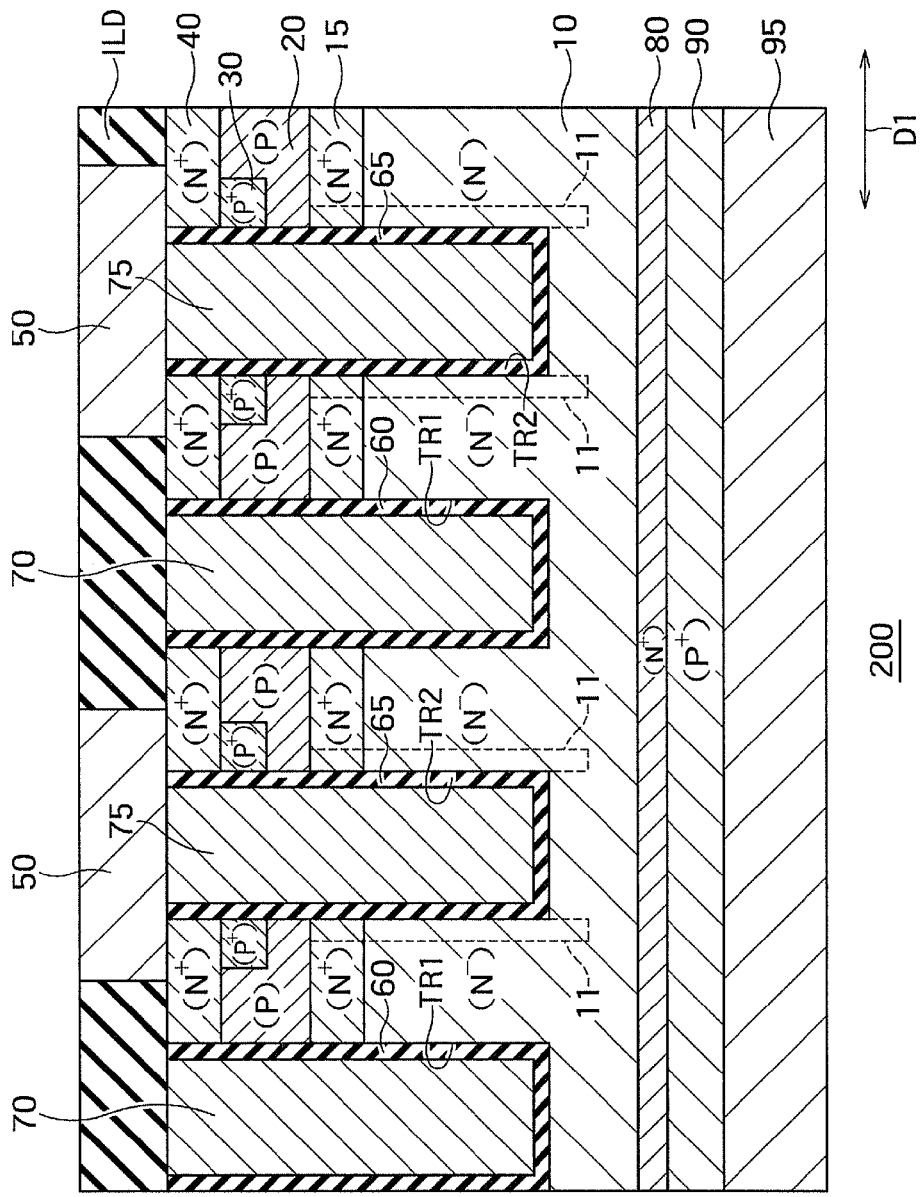
FIG. 3 is a cross-sectional view showing an example of a configuration of an IGBT 200 according to a second embodiment.

FIG. 3 is a cross-sectional view showing an example of a configuration of an IGBT 200 according to a second embodiment. An n-impurity concentration of the n-base layer 10 on the side of the second electrode 75 is lower than that of the n-base layer 10 on the side of the gate electrode 70. FIG. 3 indicates a lower impurity concentration region in the n-base layer 10 on the side of the second electrode 75 as a low concentration region 11. The low concentration region 11 can be provided not only in the n-base layer 10 but also in the first barrier layer 15.

Other configurations of the second embodiment can be identical to corresponding ones of the first embodiment. The thickness of the second insulating film 65 can be set equal to that of the gate dielectric film 60. However, similarly to the first embodiment, the thickness of the second insulating film 65 can be set smaller than that of the gate dielectric film 60.

According to the second embodiment, the threshold voltage of the p-channel in the n-base layer 10 on the side of the second electrode 75 is decreased because an IGBT cell of the IGBT 200 includes the low concentration region 11. As a result, when the IGBT 200 is operated and made into an ON-state, the resistances of the n-base layer 10 and the first barrier layer 15 on the side of the second electrode 75 is decreased and many holes flow into the n-base layer 10 on the side of the second electrode 75.

Accordingly, the second embodiment achieves effects identical to those of the first embodiment. Furthermore, when the thickness of the second insulating film 65 is smaller than that of the gate dielectric film 60 similarly to the first embodiment, the threshold voltage of the p-channel in the n-base layer 10 and the first barrier layer 15 on the side of the second electrode 75 is further decreased. As a result, when the IGBT 200 is operated and made into an ON-state, the resistances of the n-base layer 10 and the first barrier layer 15 on the side of the second electrode 75 are further decreased. Therefore, the second embodiment combined with the first embodiment makes it more difficult to cause negative capacitance.

(Manufacturing Method of IGBT 200)

In the manufacturing of the IGBT 200 according to the second embodiment, it suffices to implant p-impurity ions into the low concentration region 11 after forming the trenches TR1 and TR2.

For example, after forming the first barrier layer 15, the p-base layer 20, the charge extraction layer 30, and the emitter layer 40 on the n-base layer 10 using the known processes, the trenches TR1 and TR2 are formed using the lithographic technique and the etching technique.

Next, the inner surfaces of the trenches TR1 and TR2 are oxidized using the thermal oxidization method. The gate dielectric film 60 is thereby formed. The trench TR1 is covered with a photoresist and the trench TR2 is exposed using the lithographic technique and the etching technique.

Next, the p-impurity ions (boron ions, for example) are implanted into an inner side surface of the trench TR2 from an oblique direction. The low concentration region 11 is thereby formed on the inner side surface of the trench TR2. At this time, the low concentration region 11 is formed up to a deeper position than a bottom of the trench TR2 along a side surface of the trench TR2.

Thereafter, the photoresist is removed, and the material of the gate electrode 70 and the second electrode 75 is buried in the trenches TR1 and TR2 using the known process. Furthermore, the second barrier layer 80, the collector layer 90, the interlayer dielectric film ILD, the emitter electrode 50, and the collector electrode 95 are formed. The IGBT 200 is thereby completed.

As described above, a manufacturing method of the IGBT 200 according to the second embodiment can be realized by adding one lithographic process, and one implantation process to the manufacturing process of the first embodiment. Therefore, the IGBT 200 according to the second embodiment can be manufactured without any particular large cost increase.

Third Embodiment

Figure 4:
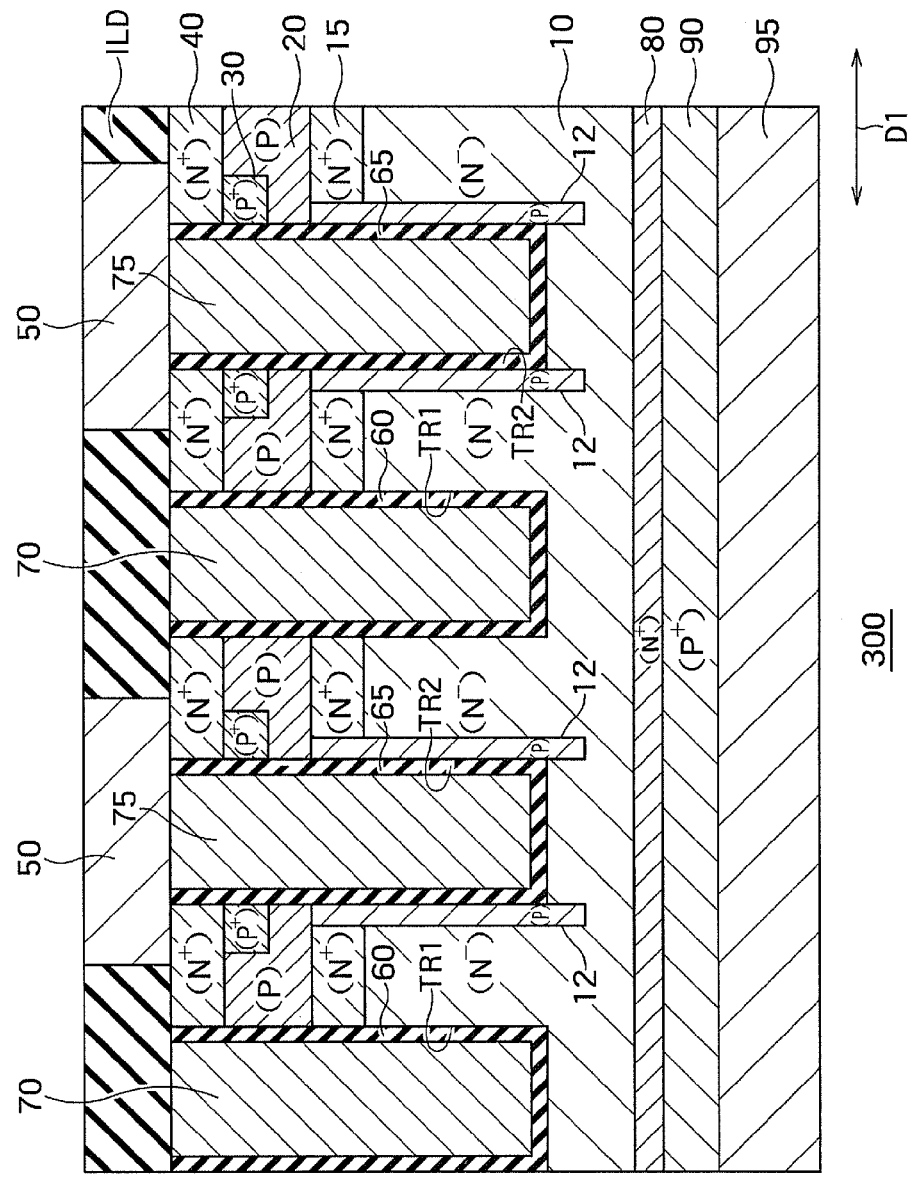
FIG. 4 is a cross-sectional view showing an example of a configuration of an IGBT 300 according to a third embodiment.

FIG. 4 is a cross-sectional view showing an example of a configuration of an IGBT 300 according to a third embodiment. In an IGBT cell of the IGBT 300, a p-drift diffusion layer 12 is provided between the n-base layer 10 and the second insulating film 65. The drift diffusion layer 12 can be provided not only in the n-base layer 10 but also between the first barrier layer 15 and the second insulating film 65.

Other configurations of the third embodiment can be identical to corresponding ones of the first embodiment. The thickness of the second insulating film 65 can be set equal to that of the gate dielectric film 60. Similarly to the first embodiment, the thickness of the second insulating film 65 can be set smaller than that of the gate dielectric film 60.

According to the third embodiment, the IGBT cell of the IGBT 300 includes the p-drift diffusion layer 12. Therefore, when the IGBT 300 is operated and made into an ON-state, the resistances of the n-base layer 10 and the first barrier layer 15 on the side of the second electrode 75 are further decreased and many holes flow into the n-base layer 10 on the side of the second electrode 75. Accordingly, the third embodiment achieves effects identical to those of the first embodiment.
(Manufacturing Method of IGBT 300)

In the manufacturing of the IGBT 300 according to the third embodiment, it suffices to implant p-impurity ions into the p-drift diffusion layer 12 after forming the trenches TR1 and TR2.

For example, after forming the first barrier layer 15, the p-base layer 20, the charge extraction layer 30, and the emitter layer 40 on the n-base layer 10 using the known processes, the trenches TR1 and TR2 are formed using the lithographic technique and the etching technique.

Next, the inner surfaces of the trenches TR1 and TR2 are oxidized using the thermal oxidization method. The gate dielectric film 60 is thereby formed. Next, the trench TR1 is covered with a photoresist and the trench TR2 is exposed using the lithographic technique and the etching technique.

Next, the p-impurity ions (boron ions, for example) are implanted into the inner side surface of the trench TR2 from the oblique direction. At this time, highly concentrated p-impurity ions are implanted so that the n-base layer 10 is inverted to a p-layer. The p-drift diffusion layer 12 is thereby formed on the inner side surface of the trench TR2. At this time, the p-drift diffusion layer 12 is formed up to the deeper position than the bottom of the trench TR2 along the side surface of the trench TR2.

Thereafter, the photoresist is removed, and the material of the gate electrode 70 and the second electrode 75 is buried in the trenches TR1 and TR2 using the known process. Furthermore, the second barrier layer 80, the collector layer 90, the interlayer dielectric film ILD, the emitter electrode 50, and the collector electrode 95 are formed. The IGBT 300 is thereby completed.

As described above, a manufacturing method of the IGBT 300 according to the third embodiment can be realized by adding one lithographic process, and one implantation process to the manufacturing process of the first embodiment. Therefore, the IGBT 300 according to the third embodiment can be manufactured without any particular large cost increase.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first base layer of a first conduction type;
a second base layer of a second conduction type provided above the first base layer;
a first semiconductor layer of the first conduction type above opposite side of the second base layer to the first base layer;
a second semiconductor layer of the second conduction type above opposite side of the first base layer to the second base layer;
a plurality of first electrodes which are provided at the first semiconductor layer and the second base layer via first insulating films; and
a second electrode provided between adjacent ones of the first electrodes and provided at the first semiconductor layer and the second base layer via a second insulating film, wherein
a resistance of the first base layer above a side of the second electrode is lower than a resistance of the first base layer above a side of the first electrodes.

2. The device of claim 1, wherein a voltage of the second electrode is substantially equal to a voltage of the first semiconductor layer.

3. The device of claim 1, wherein a thickness of the second insulating film provided between the first base layer and the second electrode is smaller than a thickness of the first insulating film provided between the first base layer and one of the first electrodes.

4. The device of claim 2, wherein a thickness of the second insulating film provided between the first base layer and the second electrode is smaller than a thickness of the first insulating film provided between the first base layer and one of the first electrodes.

5. The device of claim 1, wherein a concentration of a first conduction type impurity at the first base layer above the side of the second electrode is lower than a concentration of the first conduction type impurity at the first base layer above the side of the first electrodes.

6. The device of claim 2, wherein a concentration of a first conduction type impurity at the first base layer above the side of the second electrode is lower than a concentration of the first conduction type impurity at the first base layer above the side of the first electrodes.

7. The device of claim 1, further comprising a drift diffusion layer of the second conduction type provided between the first base layer above the side of the second electrode and the second insulating film.

8. The device of claim 1, further comprising:
a first barrier layer of the first conduction type provided between the first base layer and the second base layer; and
a second barrier layer of the first conduction type provided between the first base layer and the second semiconductor layer.

* * * * *